United States Patent
Kanda et al.

[11] Patent Number: 5,837,421
[45] Date of Patent: Nov. 17, 1998

[54] WATER-DEVELOPABLE PHOTOSENSITIVE RESIN COMPOSITION

[75] Inventors: Kazunori Kanda, Yao; Koichi Ueda, Neyagawa; Tadahiro Kakiuchi, Kawanishi; Hisaichi Muramoto, Hirakata; Kenji Yasuda, Yokkaichi; Hozumi Sato, Tsukuba; Katsuo Koshimura; Takashi Nishioka, both of Yokkaichi, all of Japan

[73] Assignees: Nippon Paint Co., Ltd., Osaka-fu; Japan Synthetic Rubber Co., Ltd., Tokyo-to, both of Japan

[21] Appl. No.: 904,267

[22] Filed: Jul. 31, 1997

Related U.S. Application Data

[63] Continuation of Ser. No. 570,632, Dec. 11, 1995, abandoned.

[30] Foreign Application Priority Data

Dec. 9, 1994 [JP] Japan .................................. 6-306212

[51] Int. Cl.$^6$ .................................................. G03C 1/725
[52] U.S. Cl. ................................... 430/281.1; 430/282.1; 430/286.1; 430/302
[58] Field of Search ........................... 430/281.1, 282.1, 430/286.1, 302

[56] References Cited

U.S. PATENT DOCUMENTS

| | | | |
|---|---|---|---|
| 4,275,142 | 6/1981 | Hosaka et al. | 430/271 |
| 4,369,246 | 1/1983 | Chen et al. | 430/306 |
| 5,175,076 | 12/1992 | Ishikawa et al. | 430/281 |
| 5,238,783 | 8/1993 | Taniguchi et al. | 430/281 |
| 5,348,844 | 9/1994 | Garmong | 430/286 |

FOREIGN PATENT DOCUMENTS

| | | |
|---|---|---|
| 0 366 077 A3 | 5/1990 | European Pat. Off. . |
| 0 607 962 A1 | 7/1994 | European Pat. Off. . |
| 0 675 412 A1 | 10/1995 | European Pat. Off. . |
| 3604402 A1 | 8/1986 | Germany . |
| 61-95349 | 5/1986 | Japan . |
| 61-181811 | 8/1986 | Japan . |

*Primary Examiner*—Mark Chapman
*Attorney, Agent, or Firm*—Wenderoth, Lind & Ponack, L.L.P.

[57] ABSTRACT

A photosensitive resin composition is provided which is excellent in water developability, impact resilience, resin plate strength after exposure, breaking extension, and resin-plate transparency. The composition comprises:

(1) a granular copolymer produced by polymerizing a monomer mixture comprising:
  (i) an aliphatic conjugated diene monomer;
  (ii) a monomer expressed by the general formula (I):

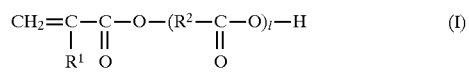

(in which $R^1$ represents a hydrogen atom or a methyl group, $R^2$ represents an alkylene group having a carbon number of 3 to 20, and l represents an integer of 1 to 20);
  (iii) a monomer having at least two addition-polymerizable groups, and
  (iv) an addition-polymerizable monomer other than (i), (ii) and (iii), if desirable;
(2) a photo-polymerizable unsaturated monomer;
(3) an amino group-containing compound, and
(4) a photo-polymerization initiator.

22 Claims, No Drawings

WATER-DEVELOPABLE PHOTOSENSITIVE RESIN COMPOSITION

This application is a continuation of Ser. No. 08/570,632, filed Dec. 11, 1995 now abandoned.

BACKGROUND OF THE INVENTION

1. Field of the Invention

The present invention relates to a photosensitive resin composition. More particularly, the invention relates to a photosensitive resin composition, in particular, for flexographic printing plate, which is less liable to characteristic changes due to water, such as swelling, strength decrease, and dimensional change, and yet has high impact resilience, good printability, and is developable with water.

2. Description of the Prior Art

Various kinds of photosensitive resin compositions have been widely utilized in such fields as photoresist, printing ink, and plate making.

Typically known as such prior art photosensitive resin compositions are compositions containing a cyclized rubber and a bisazide compound; compositions containing a thermoplastic elastomer, an acrylic monomer, and a photo-polymerization initiator; and compositions comprised principally of photosensitive resins, such as polyester acrylate, epoxy acrylate, polyvinyl cinnamate, chloromethylated polystyrene, and aromatic azido group-containing resins. These photosensitive resin compositions are all water-insoluble and are, without exception, dependent upon the use of organic solvents for development. Recently, however, the use of organic solvents has given rise to grave concern because of their effects upon the environment, in addition to problems raised from the standpoints of safety at work and health protection.

As a solution to the foregoing problems there have been known alkali-developable photosensitive resin compositions containing, for example, a novolak resin or poly(vinyl phenol) and a quinone diazide compound. However, as a more safe and more convenient approach, a water-developable photosensitive resin composition has been desired.

In attempts to meet the need for such a water-developable photosensitive resin composition there have been proposed water soluble resin-based compositions including, for example, a composition containing a water soluble resin, such as polyvinyl alcohol, gelatin and casein, sodium dichromate, and diazonium salt or bisazide compound; and a composition consisting of a water soluble resin, a water-soluble acrylic monomer, and a photo-polymerization initiator.

However, such a water-developable photosensitive resin composition of the prior art has a drawback that the base resin has excessively high affinity for water, which is likely to be a cause of swelling during the stage of development, which in turn may result in a strength decrease and/or dimensional change. This eventually leads to problems such as lowered dimensional accuracy of the resist, lowered durability of the printing plate with respect to printing, and lowered print quality.

In an attempt to solve problems with such water-developable photosensitive resin composition, there have been proposed photosensitive resin compositions of the type which comprises a copolymer soluble in alkaline aqueous solutions and composed of a conjugated diene compound or acrylic ester compound, α, β-ethylenic unsaturated carboxylic acid, and a polyfunctional vinyl compound, and in mixture therewith a photo-polymerizable unsaturated monomer, an amino group-containing compound, and a photo-polymerization initiator (as described in, for example, Japanese Patent Application Laid-Open Nos. 60-179411, 60-219208, and 61-181811).

Other types of water-developable photosensitive resin compositions are also known including a composition which comprises a partially crosslinked copolymer of an aliphatic conjugated diene, α, β-ethylenic unsaturated carboxylic acid and a polyfunctional vinyl compound, an aliphatic conjugated diene polymer having a molecular weight of not less than 5000, a photo-polymerizable unsaturated monomer, a basic nitrogen atom-containing compound, and a photo-polymerization initiator (as disclosed in, for example, Japanese Patent Application Laid-Open No. 1-300246); a composition comprising a polymer having a tertiary amino group and a polymerizable unsaturated group, α, β-ethylenic unsaturated monomer having a free acid radical, a photo-polymerizable unsaturated monomer, and a photo-polymerization initiator (as disclosed in, for example, Japanese Patent Application Laid-Open No. 61-246742); and a composition which comprises a photo-polymerizable unsaturated monomer, an amino group-containing compound (where, at least a portion of the photo-polymerizable unsaturated monomer or amino group-containing compound has a (meth)acryloyl group), and an aromatic ketone, and which may sometimes have a further polymer content (as disclosed in, for example, Japanese Patent Application Laid-Open No. 61-228002).

However, these photosensitive resin compositions have not proved satisfactory in respect of overall characteristic balance considering water developability, photo-setting property, post-development flexibility, impact resilience, rubber hardness, and mechanical strength.

SUMMARY OF THE INVENTION

The object of the present invention is to provide a water-developable photosensitive resin composition showing overall characteristic balance, that is, which has good water developability, is less liable to swelling during the stage of water development, and is less subject to strength property deterioration, dimensional change, etc., and which has good mechanical strength with respect to post-exposure resin plates, exhibits satisfactory breaking extension and high impact resilience.

The present invention relates to a water-developable photosensitive resin composition comprising:

(1) a granular copolymer produced by polymerizing a monomer mixture ((i)+(ii)+(iii)+(iv)=100 mol %) comprising:
  (i) 10 to 95 mol % of an aliphatic conjugated diene monomer,
  (ii) 0.1 to 30 mol % of a monomer represented by the following general formula (I):

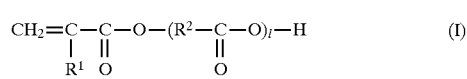

$$CH_2=C-C-O-(R^2-C-O)_l-H \qquad (I)$$
$$\phantom{CH_2=}\;|\;\;\|\phantom{-O-(R^2-}\|$$
$$\phantom{CH_2=}R^1\;O\phantom{-O-(R^2-}O$$

(in which $R^1$ represents a hydrogen atom or a methyl group, $R^2$ represents an alkylene group having a carbon number of 3 to 20, and l represents an integer of 1 to 20),
  (iii) 0.1 to 20 mol % of a monomer having at least two addition-polymerizable groups, and
  (iv) 0 to 70 mol % of an addition-polymerizable monomer other than (i), (ii) and (iii);

(2) a photo-polymerizable unsaturated monomer;
(3) an amino group-containing compound, and
(4) a photo-polymerization initiator.

DETAILED DESCRIPTION OF THE INVENTION

The present invention provides a water-developable photosensitive resin composition comprising:

(1) a granular copolymer produced by polymerizing a monomer mixture ((i)+(ii)+(iii)+(iv)=100 mol %) comprising:
  (i) 10 to 95 mol % of an aliphatic conjugated diene monomer,
  (ii) 0.1 to 30 mol % of a monomer represented by the following general formula (I):

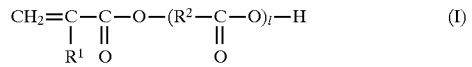

(in which $R^1$ represents a hydrogen atom or a methyl group, $R^2$ represents an alkylene group having a carbon number of 3 to 20, and l represents an integer of 1 to 20),
  (iii) 0.1 to 20 mol % of a monomer having at least two addition-polymerizable groups, and
  (iv) 0 to 70 mol % of an addition-polymerizable monomer other than (i), (ii) and (iii);
(2) a photo-polymerizable unsaturated monomer;
(3) an amino group-containing compound, and
(4) a photo-polymerization initiator.

The water-developable photosensitive resin composition in accordance with the present invention includes as a first component thereof a granular copolymer (1) (hereinafter sometimes merely called "copolymer (1)") which comprises monomer components (i), (ii), (iii) to be described hereinafter and may contain one or more copolymerizable monomers (iv) other than (i), (ii) and (iii) when required.

The monomer component (i) of the copolymer (1) serves to impart such elastic properties as strength, elongation, and impact resilience to the composition after photo-setting reaction. Examples of such monomers include butadienes, especially 1,3-butadiene, isoprene, 1,3-pentadiene, 1,3-hexadiene, 2,3-dimethyl-1,3-butadiene, 4,5-diethyl-1,3-octadiene, 3-butyl-1,3-octadiene, chloroprene, 2,3-dichloro-1,3-butadiene, 1,3-cyclopentadiene, and a mixture thereof. Butadiene and isoprene are particularly preferred from the viewpoints of mechanical strength and impact resilience.

The proportion of the monomer component (i) is 10 to 95 mol %, preferably 30 to 90 mol %. If the proportion of the component (i) is less than 10 mol %, the composition after photo-setting is lower in strength. If the proportion is more than 95 mol %, the photosensitive resin composition has unfavorable water developability.

The monomer (ii) as a second component of the copolymer (1) is expressed by the general formula (I):

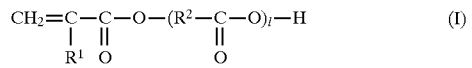

In the formula, $R^1$ represents a hydrogen atom or a methyl group; $R^2$ represents an alkylene group having a carbon number of 3 to 20, preferably 3 to 10, such as propylene group or butylene group; and l is an integer of 1 to 20, preferably 1 to 10.

Examples of compounds expressed by the general formula (I) specifically include the following:

$CH_2=CHCOO-C_3H_6COOH$, $CH_2=CHCOO-C_4H_8COOH$, $CH_2=CHCOO-C_5H_{10}COOH$, $CH_2=CHCOO-(C_3H_6COO)_2-H$, $CH_2=CHCOO-(C_4H_8COO)_2-H$, $CH_2=CHCOO-(C_5H_{10}COO)_2-H$, $CH_2=CHCOO-(C_5H_{10}COO)_3-H$, $CH_2=CHCOO-(C_5H_{10}COO)_4-H$, $CH_2=CHCOO-(C_5H_{10}CHCOO)_5-H$, $CH_2=C(CH_3)COO-C_3H_6COOH$, $CH_2=C(CH_3)COO-C_4H_8COOH$. $CH_2=C(CH_3)COO-C_5H_{10}COOH$, $CH_2=C(CH_3)COO-(C_3H_6COO)_2-H$, $CH_2=C(CH_3)COO-(C_4H_8COO)_2-H$, $CH_2=C(CH_3)COO(C_5H_{10}COO)_2-H$, $CH_2=C(CH_3)COO-(C_5H_{10}COO)_3-H$, $CH_2=C(CH_3)COO-(C_5H_{10}COO)_4-H$, and $CH_2=C(CH_3)COO-(C_5H_{10}COO)_5-H$.

The above monomers (ii) serve to impart water developability to the composition and also give improved rubber resiliency and/or impact resilience to the composition, and may be used alone or in combination of two or more kinds according to the purpose for which the composition is to be used.

Preferred among these compounds are those meeting the conditions that in the general formula (I), $R^2$ is an alkylene group having a carbon number of 3 to 7, and l is an integer of 1 to 5. From the viewpoints of water developability and elasticity, especially preferred is ε—caprolactone modified carboxylic monomer such that in the general formula (I), $R^1=H$, $CH_3$, $R^2=C_5H_{10}$, and l=1–4.

The proportion of the monomer component (ii) is 0.1 to 30 mol %, preferably 0.5 to 20 mol %. If the proportion of the component (ii) is 0.1 mol %, the resulting photosensitive resin composition does not have sufficient water developability. If the proportion is more than 30 mol %, the composition has only low solidity maintenance, and after photo-setting the composition will have only low impact resilience or become brittle.

The monomer component (iii) of the copolymer (1) plays a role to render the copolymer-containing composition water developable. Useful as such components are, for example, ethylene glycol di(meth)acrylate, trimethylolpropane di(meth)acrylate, trimethylolpropane tri(meth)acrylate, propylene glycol dimethacrylate, propylene glycol diacrylate, divinylbenzene, trivinylbenzene, pentaerythritol tri(meth)acrylate, pentaerythritol tetra(meth)acrylate, 1,4-butanediol di(meth)acrylate, and 1,6-hexanediol di(meth)acrylate. These polyfunctional polymerizable monomers may be used alone or in a mixture of two or more kinds.

Particularly preferred of these monomers are divinylbenzene and ethylene glycol di(meth)acrylate from the viewpoints of transparency, mechanical strength, and water development aspect.

The proportion of the monomer component (iii) is 0.1 to 20 mol %, preferably 0.5 to 10 mol %. If the proportion of the component (iii) is less than 0.1 mol %, the resulting composition is less water-developable. If the proportion is more than 20 mol %, the particulate polymer is rendered less compatible with the photo-polymerizable monomer, resulting in poor processability. Further, the composition, after photo-setting, is liable to noticeable decrease in strength.

The monomer component (iv) other than (i), (ii) and (iii), which may be added as needed, is intended for improvement in processability, durability with respect to printing, resistance to organic solvents, ink resistance, and printability with respect to the resin composition, and compounds for use as such are not particularly limited if they have one addition-polymerizable group. Examples of such compounds include styrene, α-methylstyrene, vinyltoluene, acrylonitrile, vinyl chloride, vinylidene chloride, (meth)acrylamide, methyl (meth)acrylate, ethyl (meth)acrylate, n-propyl (meth)acrylate, and 2-ethylhexyl (meth)acrylate. Also, useful as such are, for example, unsaturated (mono) carboxylic acids, such as (meth)acrylic acid, crotonic acid, and cinnamic acid; unsaturated polycarboxylic acids (anhydrides), such as maleic acid (anhydride), fumaric acid, itaconic acid (anhydride), citraconic acid, and mesaconic acid; carboxylic free radical-containing esters, such as monomethyl, monoethyl, monopropyl, monohexyl, monooctyl, dimethyl, diethyl, dipropyl, and dibutyl esters of aforesaid unsaturated polycarboxylic acids (anhydrides); carboxylic free radical-containing nitriles, such as mononitriles of aforesaid unsaturated carboxylic acids; and carboxylic free radical-containing esters, such as monoesters of non-polymerizable polyvalent carboxylic acids such as phthalic acid, succinic acid, and adipic acid with hydroxyl group-containing unsaturated compounds, such as allyl alcohol and 2-hydroxyethyl (meth)acrylate.

The proportion of the polymerizable monomer component (iv) is not more than 70 mol %, preferably from 1 to 40 mol %, based on the total quantity of the entire monomer components. The use of the component (iv) in a proportion of more than 70 mol % will entail problems, such as lower rubber elasticity and/or mechanical strength, lower water developability, lower stability, and lower transparency, with respect to the resulting composition.

From the viewpoints of rubber elasticity, mechanical properties, resistance to solvents, composition processability, and durability with respect to printing, especially preferred of the above compounds are methyl (meth) acrylate, ethyl (meth)acrylate, styrene, acrylonitrile, 2-ethylhexyl (meth)acrylate, and (meth)acrylic acid.

Copolymer (1) is prepared in the form of granular copolymer by the emulsion polymerization technique using a radical initiator or by the suspension polymerization technique. From the standpoints of particle size and particle size uniformity, it is preferable to employ the emulsion polymerization technique. Monomer components and polymerization agents, such as radical initiator, may be loaded in their entire quantities at the start of reaction, or may be loaded in any separate quantities after the start of reaction. Polymerization is carried out in a reactor which has been made to remove oxygen, in a temperature range of from 0° to 80° C., but operating conditions, such as temperature and agitation, may be varied as desired in the course of reaction. For polymerization, either a continuous operation system or a batch operation system may be employed.

Radical initiators available for use include organic peroxides, such as benozoyl peroxide, cumene hydroperoxide, paramethane hydroperoxide, and lauroyl peroxide; diazo compounds, such as azobis isobutyronitrile; inorganic compounds, such as potassium persulfate; and redox catalysts, such as organic compound-ferrous sulfate combinations.

Copolymer (1) is preferably in a granular form, and is prepared in a mean particle size of from 5 to 800 nm, preferably from 10 to 300 nm, more preferably from 30 to 200 nm. If the particle size is larger than 800 nm, the resulting composition will not exhibit any reasonable plate making property when it is used for resin plate fabrication, nor will it have any desired strength. If the particle size is smaller than 5 nm, the resulting composition will have only poor rubber elasticity and unfavorable water developability. The particle surface of the granular copolymer is rendered hydrophilic and the particle interior is rendered hydrophobic so that the water-developable photosensitive resin composition may have further improvement in its water resistance and water developability.

The composition of the present invention includes as a second component thereof a photo-polymerizable unsaturated monomer (2). Examples of such monomers include:

aromatic vinyl compounds, such as styrene, α-methylstyrene, o-methylstyrene, m-methylstyrene, p-methylstyrene, p-t-butylstyrene, o-methoxystyrene, m-methoxystyrene, p-methoxystyrene, di-isopropenyl benzene, divinylbenzene, o-chlorostyrene, m-chlorostyrene, p-chlorostyrene, N, N-dimethyl-p-aminostyrene, N, N-diethyl-p-aminostyrene, and vinylpyridine;

unsaturated nitrile compounds, such as (meth) acrylonitrile (which denotes acrylonitrile and methacrylonitrile), α-chloroacrylonitrile, α-chloromethyl acrylonitrile, α-methoxy acrylonitrile, α-ethoxy acrylonitrile, nitrile crotonate, nitrile cinnamate, dinitrile itaconate, dinitrile maleate, and dinitrile fumarate;

alkyl (meth)acrylates, such as methyl (meth)acrylate (which denotes methyl acrylate and methyl methacrylate), ethyl (meth)acrylate, n-propyl (meth) acrylate, isopropyl (meth)acrylate, n-butyl (meth) acrylate, isobutyl (meth)acrylate, sec-butyl (meth) acrylate, tert-butyl (meth)acrylate, n-amyl (meth) acrylate, 2-ethylhexyl (meth)acrylate, n-octyl (meth) acrylate, lauryl (meth)acrylate, and stearyl (meth) acrylate;

unsaturated monocarboxylates, such as methyl crotonate, ethyl crotonate, propyl crotonate, butyl crotonate, methyl cinnamate, ethyl cinnamate, propyl cinnamate, and butyl cinnamate;

fluoroalkyl (meth)acrylates, such as trifluoroethyl (meth) acrylate, pentafluoropropyl (meth)acrylate, and heptafluorobutyl (meth)acrylate;

mono- or di-(meth)acrylates of alkylene glycols, such as ethylene glycol, 1,2-propane diol, 1,3-propane diol, 1,4-butane diol, 1,5-pentane diol, 1,6-hexane diol;

mono- or di-(meth)acrylates of polyalkylene glycols (having from 2 to 23 alkylene glycol units), such as polyethylene glycol and polypropylene glycol;

alkoxyalkyl (meth)acrylates, such as 2-methoxyethyl (meth)acrylate, 2-ethoxyethyl (meth)acrylate, 2-methoxypropyl (meth)acrylate, 2-ethoxypropyl (meth)acrylate, 3-methoxypropyl (meth)acrylate, and 3-ethoxypropyl (meth)acrylate;

(meth)acrylates of alkoxy alkylene glycols or alkoxy polyalkylene glycols (having, for example, from 2 to 23 alkylene glycol units), such as methoxyethylene glycol, methoxypropylene glycol, methoxypolyethylene glycol, ethoxypolyethylene glycol, methoxypolypropylene glycol, and ethoxypolypropylene glycol;

allyloxyalkyl (meth)acrylates, such as 2-phenoxyethyl (meth)acrylate, 2-phenoxypropyl (meth)acrylate, and 3-phenoxypropyl (meth)acrylate;

mono-(meth)acrylates of allyloxypolyalkylene glycols, such as phenoxypolyethylene glycol and phenoxypolypropylene glycol;

cyanoalkyl (meth)acrylates, such as cyanoethyl (meth) acrylate and cyanopropyl (meth)acrylate;

oligo-(meth)acrylates such as di-, tri- or tetra- (meth) acrylates of polyvalent alcohols, such as glycerin, 1,2, 4-butanetriol, pentaerythritol, trimethylol alkane (alkane having a carbon number of, for example, from 1 to 3), tetramethylol alkane (alkane having a carbon number of, for example, from 1 to 3);

mono- or oligo-(meth)acrylates of polyalkylene glycol adducts of trivalent or higher alcohols;

mono- or di-(meth)acrylates of cyclic polyols, such as 1,4-cyclohexane diol, 1,4-benzene diol, and 1,4-dihydoxyethyl benzene;

hydroxyalkyl (meth)acrylates, such as 2-hydroxyethyl (meth)acrylate, 2-hydroxypropyl (meth)acrylate, 3-hydroxypropyl (meth)acrylate, 3-chloro-2-hydroxypropyl (meth)acrylate, 2-hydroxybutyl (meth)acrylate, 3-hydroxybutyl (meth)acrylate, and 4-hydroxybutyl (meth)acrylate;

mono-(meth)acrylates of (poly)alkylene glycols, such as glycerol mono-(meth)acrylate, polyethylene glycol mono-(meth)acrylate (having, for example, from 2 to 20 polyethlene glycol units) and polypropylene glycol mono-(meth)acrylate (having, for example from 2 to 20 polypropylene glycol units);

free hydroxyl group-containing (meth)acrylates of trivalent or higher polyvalent alcohols, such as glycerol di-(meth)acrylate, 1,2,4-butanetriol mono-(meth) acrylate, 1,2,4-butanetriol di-(meth)acrylate, trimethylol alkane mono-(meth)acrylate (alkane having a carbon number of, for example, from 1 to 3), trimethylol alkane di-(meth)acrylate (alkane having a carbon number of, for example, from 1 to 3), tetramethylol alkane di-(meth)acrylate (alkane having a carbon number of, for example, from 1 to 3), and tetramethylol alkane tri-(meth)acrylate (alkane having a carbon number of, for example, from 1 to 3);

hydroxyalkyl esters of other unsaturated carboxylic acids, such as 2-hydroxyethyl crotonate, 2-hydroxypropyl crotonate, 2-hydroxyethyl cinnamate, and 2-hydroxypropyl cinnamate;

hydroxyl group-containing aromatic vinyls, such as o-hydroxystyrene, m-hydroxystyrene, p-hydroxystyrene, o-hydroxy-α-methylstyrene, m-hydroxy-α-methylstyrene, p-hydroxy-α-methylstyrene, and p-vinylbenzyl alcohol;

unsaturated alcohols, such as (meth)allyl alcohol and the like;

unsaturated (mono)carboxylic acids, such as (meth) acrylic acid, crotonic acid, and cinnamic acid;

unsaturated polycarboxylic acids (anhydrides), such as maleic acid (anhydride), fumaric acid, itaconic acid (anhydride), citraconic acid, and mesaconic acid;

free carboxyl radical-containing esters of aforesaid unsaturated polycarboxylic acids, such as monomethyl ester, monoethyl ester, monopropyl ester, monohexyl ester, monooctyl ester, dimethyl ester, diethyl ester, dipropyl ester, and dibutyl ester;

free carboxyl radical-containing nitriles, such as mononitriles, of aforesaid unsaturated polycarboxylic acids;

free carboxyl radical-containing esters, such as monoesters produced by any of non-polymerizable polyvalent carboxylic acids, such as phthalic acid, succinic acid, and adipic acid, in combination with any of hydroxyl group-containing unsaturated compounds, such as allyl alcohol and 2-hydroxyethyl (meth)acrylate;

diesters of unsaturated dicarboxylic acids, such as dimethyl maleate, diethyl maleate, dibutyl maleate, dioctyl maleate, diethyl fumarate, dibutyl fumarate, dioctyl fumarate, dimethyl itaconate, diethyl itaconate, dibutyl itaconate, and dioctyl itaconate;

epoxy group-containing unsaturated compounds, such as allyl glycidyl ether and glycidyl (meth)acrylate; and vinyl chloride, vinyl acetate, cinnamate, crotonate, dicyclopentadiene, and ethylidene norbornene.

Such photo-polymerizable unsaturated monomers are used in order to provide desired properties, such as mechanical strength, impact resilience, ink resistance, and printing-durability, with respect to the photosensitive resin composition after the stage of photo-setting.

Among the photo-polymerizable unsaturated monomers enumerated above, alkyl (meth)acrylates and alkylene glycol (meth)acrylates are preferred from the viewpoints of compatibility with the granular copolymer (1), and mechanical strength and impact resilience desired of the composition.

The photo-polymerizable unsaturated monomer (2) may be used in any desired proportion according to the specific purpose for which the composition is used, and may be freely designed within a fluidity range of from wax form to low-viscosity liquid form according to the proportion thereof. Preferably, the monomer (2) is used within a proportion range of from 5 to 1,000 parts by weight, more preferably from 10 to 500 parts by weight, relative to 100 parts by weight of the copolymer (1). If the proportion is less than 5 parts by weight, the resulting resin composition will be unfavorably low in strength. If the proportion is more than 1,000 parts by weight, the composition is liable to considerable shrinkage upon being photo-set, which fact makes it impracticable to realize compatibility between water resistance and water developability with respect to the composition. In addition, the freedom of viscosity design for the composition will be lowered.

The water-developable photosensitive resin composition of the invention includes an amino group-containing compound (3) as a third component thereof. This component (3) functions to impart water developability to the composition. For the component may be used, for example, ammonia or any organic compound having one or more of primary, secondary, and tertiary amino groups. Preferred organic compounds are amines having tertiary amino groups.

Examples of primary amines include methylamine, ethylamine, propylamine, and butylamine.

Examples of secondary amines include dimethylamine, methyl ethyl amine, diethylamine, methyl propyl amine, ethyl propyl amine, dipropylamine, and dibutylamine.

Examples of tertiary amines include:

trialkyl amines, such as trimethylamine, methyl diethylamine, dimethyl ethylamine, triethylamine, dimethyl propylamine, methyl ethyl propylamine, diethyl propylamine, methyl dipropylamine, ethyl dipropylamine, tripropylamine, dimethyl butylamine, methyl dibutylamine, methyl ethyl butylamine, diethyl butylamine, ethyl dibutylamine, methyl propyl butylamine, ethyl propyl butylamine, dipropyl butylamine, propyl dibutylamine, and tributylamine;

alkylalkanol tertiary amines, such as dimethyl ethanolamine, methyl diethanolamine, diethyl ethanolamine, and ethyl diethanolamine;

trialkanol amines, such as triethanolamine, diethanol propanolamine, ethanol dipropanolamine, and tripropanolamine;

N,N-dialkylamino alkoxyalkanols, such as N,N-dimethylamino ethoxyethanol, N,N-diethylamino ethoxyethanol, N,N-dimethylamino ethoxypropanol, and N,N-diethylamino ethoxypropanol;

N,N-dialkylamino alkyl (meth)acrylates, such as N,N-dimethylaminoethyl (meth)acrylate, N,N-diethylaminoethyl (meth)acrylate, N,N-dipropylaminoethyl (meth)acrylate, N,N-dimethylaminopropyl (meth)acrylate, N,N-diethylaminopropyl (meth)acrylate, and N,N-dipropylamino propyl (meth)acrylate;

N,N-dialkylamino alkoxyalkyl (meth)acrylates, such as N,N-dimethylamino ethoxyethyl (meth)acrylate, and N,N-diethylamino ethoxyethyl (meth)acrylate;

tertiary amino group-containing (meth)acryl amides, such as N-(N',N'-dimethylaminoethyl) (meth)acrylamide, N-(N',N'-diethylaminoethyl) (meth)acrylamide, N-(N', N'-dimethylaminopropyl) (meth)acrylamide, and N-(N', N'-diethylaminopropyl) (meth)acrylamide; and tertiary amino group-containing carbamates, such as N,N-dimethylaminoethyl-N'-(meth)acryloyl carbamate, and N,N-diethylaminoethyl-N'-(meth)acryloyl carbamate.

Among the above amino group-containing compounds, tertiary amines which can provide good water developability are preferably used. Especially from the viewpoint of mechanical strength of the composition after photo-setting, it is more preferable to use tertiary amino group-containing compounds which include α,β-ethylenic unsaturated groups, such as tertiary amino group-containing (meth)acrylate and tertiary amino group-containing (meth)acrylamide.

The amino group-containing compound (3) of the invention is used in the amount of not less than 2 parts by weight, preferably not less than 5 parts by weight, relative to 100 parts by weight of the copolymer component (1). Within this proportional range, aforesaid amino group-containing compounds may be used alone or in combination of two or more kinds. If the proportion of the amino group-containing compound (3) is less than 2 parts by weight, it is impracticable to provide sufficient water developability. Use of the compound (3) in excess of 50 parts by weight would not result in any improvement in water developability. From the standpoint of neutralization, the amino group-containing compound (3) is used preferably within a range of from 50 to 200 mol %, more preferably from 90 to 150 mol %, of the acid radical equivalent of the copolymer (1).

The photosensitive resin composition of the present invention includes a photo-polymerization initiator (4) as a fourth component thereof. As examples of such initiators may be enumerated α-diketone compounds, such as diacetyl and benzyl; acyloins, such as benzoin and pivaloin; acyloin ethers, such as benzoin methyl ether, benzoin ethyl ether, and benzoin propyl ether; polynuclear quinones, such as anthraquinone and 1,4-naphthoquinone; acetophenones, such as 2,2-dimethoxyphenyl acetophenone and trichloroacetophenone; and benzophenones, such as benzophenone and methyl-o-benzoylbenzoate. Other conventional photopolymerization initiators may also be used.

The proportion of the photo-polymerization initiator (4) is preferably from 0.1 to 20 parts by weight, more preferably from 0.5 to 10 parts by weight, relative to 100 parts by weight of the copolymer (1) which is one of the essential components of the photosensitive resin composition of the invention. If the proportion is less than 0.1 part by weight, it is not possible to impart sufficient setting effect to the photosensitive resin composition. The use of such initiator in excess of 20 parts by weight is uneconomical because not all the photo-polymerization initiator participates in the reaction involved, and may sometimes result in the initiator being rendered much less compatible with the copolymer (1), photo-polymerizable unsaturated monomer (2), and amino group-containing compound (3) so that uniform dispersion cannot be obtained.

As already described, the water-developable photosensitive resin composition in accordance with the present invention comprises a granular copolymer (1), a photo-polymerizable unsaturated monomer (2), an amino group-containing compound (3), and a photo-polymerization initiator (4). In addition to the above essential components, a block copolymer may be incorporated into the composition as required.

Such block copolymer consists principally of a hard segment and a soft segment, the hard segment being a thermoplastic, non-elastic polymer block having a glass transition point of not lower than 20° C., the soft segment being an elastic polymer having a glass transition point of not higher than 10° C.

The hard segment of the block copolymer is characterized in that it is a thermoplastic non-elastic polymer block having a glass transition point of not lower than 20° C. A preferred example of a monomer component of such polymer block is an aromatic vinyl compound. More specifically, styrene, t-butyl styrene, α-methyl styrene, p-methyl styrene, divinyl benzene, 1,1-diphenyl styrene, N,N-dimethyl-p-aminoethyl styrene, N,N-diethyl-p-aminoethyl styrene, and vinyl pyridine are enumerated as such. In particular, styrene and α-methyl styrene are preferred. The hard segment of the block copolymer may be obtained by copolymerizing such aromatic vinyl compound with a conjugated diene compound and other copolymerizable monomer component as required within aforesaid glass transition temperature range.

The soft segment of the block copolymer is characterized in that it is an elastic polymer block having a glass transition point of not higher than 10° C. A preferred example of a monomer component of such polymer block is a conjugated diene compound. More specifically, 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3-butyl-1,3-octadiene, and chloroprene are enumerated as such. In order to obtain a polymer block which is industrially available and has good properties, 1,3-butadiene, isoprene, and 1,3-pentadiene are preferably used, more preferably, 1,3-butadiene and isoprene. The soft segment of the block copolymer may be obtained by copolymerizing such conjugated diene compound with the aromatic vinyl compound and other copolymerizable monomer component as required within aforesaid glass transition temperature range.

The proportion of such block copolymer, when used, may be suitably selected according to the purpose for which the composition is used, but is preferably within the range of from 0.1 to 100 parts by weight, more preferably from 1 to 90 parts by weight, especially preferably from 2 to 70 parts by weight, relative to 100 parts by weight of the copolymer (1). If the proportion of the block copolymer is less than 0.1 part by weight, the post-exposure strength of the composition may be insufficient. If the proportion is more than 100 parts by weight, the composition is likely to have lower water developability.

The water-developable photosensitive resin composition may incorporate various kinds of additives as required. For example, a thermo-addition polymerization inhibitor which functions as a storage stabilizer may be mentioned as such an additive. Examples of such thermo-addition polymerization inhibitors include:

aromatic hydroxy compounds, such as hydroquinone, hydroquinone monomethylether, mono-t-butylhydroquinone, catechole, p-t-butylcatechol, p-methoxyphenol, 2,6-di-t-butyl-p-cresol, 2,6-di-t-butyl-m-cresol, pyrogallol, and β-naphthol;

quinones, such as benzoquinone, 2,5-diphenyl-p-benzoquinone, p-toluquinone, and p-xyloquinone;

nitro-compounds, such as nitrobenzene, m-dinitrobenzene, 2-methyl-2-nitropropane, α-phenyl-t-butylnitrone, and 5,5-dimethyl-1-pyrolin-1-oxide;

amines, such as chloranilamines, diphenylamine, diphenylpicryl hydrazine, phenol-α-naphtylamine, pyridine, and phenothiazine;

sulfides, such as dithiobenzoyl sulfide and dibenzyl tetrasulfides;

unsaturated compounds, such as 1,1-diphenyl ethylene and α-methyl thioacrylonitrile;

thiazine dyes, such as Thionine Blue, toluidine blue, and methylene blue;

stabilized radicals, such as 1,1-diphenyl-2-picrylhydazyl, 1,3,5-triphenyl pheldazyl,4-hydroxy-2,2,6,6-tetramethyl piperidine-1-oxyl,2,6-di-t-butyl-α-( 3,5-di-t-butyl)-4-oxo-2,5-cyclohexadiene-1-iridene-p-trioxyl.

These thermo-addition polymerization inhibitors may be used alone or in mixture of two or more kinds.

The resin composition of the present invention may be obtained by thoroughly agitating the components, i.e., copolymer (1), photo-polymerizable unsaturated monomer (2), amino group-containing compound (3), and photo-polymerization initiator (4) by means of a kneader or intermixer while the components are being heated. The photosensitive resin composition thus obtained may be freely designed to any desired form or configuration, ranging from a non-flow wax form or rubber form to a low viscosity liquid form having good flow property.

A non-flow photosensitive resin composition may be formed into layers of a given thickness with a space having a moderate thickness inserted therebetween, or may be coated on a substrate by means of a roll coater or the like, or may be formed into a photoplate having a given thickness by compression molding or extrusion. Such plate can be made readily available for printing use by subjecting it to exposure with a negative film held in contact therewith, any unexposed area being washed away with water.

A photosensitive resin composition having good flow property may be adjusted to any desired viscosity by adding a suitable solvent as required. It may be used as a resist suited for spin coating and can provide a clean image or picture. After exposure, any unexposed area is washed away with water.

Exposure is effected by subjecting the composition to radiation of light rays corresponding to polymerization wave length of the photo-polymerizable unsaturated monomer, typically of 250 to 500 nm. The quantity of light application should be suitably set in consideration of the desired image quality, more particularly from the standpoint of consistency with respect to both dot preservation and depth of penetration, but generally a radiation of the order of 100 to 5000 mJ/cm$^2$ may be sufficient.

The photosensitive resin composition of the invention can be advantageously used as photosensitive material in the field of photo resist and photo plating, especially as a photosensitive printing plate (flexographic printing plate) and a resist material. Also, it can be widely used as photosensitive material in such areas as photosensitive inks, photosensitive adhesives, and photo molding materials.

EXAMPLES

The following examples are given to further illustrate the present invention. It is to be understood, however, that the invention is not limited by the examples but may be otherwise variously embodied within the scope and spirit of the invention.

Example 1

A copolymer (1) was prepared in accordance with the following procedure.

A monomer composition consisting of 1,3-butadiene/ω-carboxy di(pentamethylene carboxy) oxyacrylate/divinylbenzene/methyl methacrylate=80/7/1/12 (mol %) was subjected to emulsion polymerization in a 20-liter autoclave using sodium lauryl sulfate as emulsifier and potassium persulfate as polymerization initiator. After a conversion rate of 90% was reached, 0.2 parts by weight of hydroxylamine sulfate was added per 100 parts by weight of the monomer to stop polymerization. Then, the reaction liquid was heated and subjected to water vapor distillation under reduced pressure, any residual monomer being thereby removed.

Particle size measurement was made with respect to the resulting copolymer latex to find a mean particle size of 72 nm. Salting-out was carried out with the obtained latex using calcium chloride, followed by water washing and drying. As a result, a carboxyl group-containing granular copolymer (1) of clam shape was obtained.

To 100 parts by weight of the copolymer (1) were added 30 parts by weight of lauryl methacrylate and 20 parts by weight of 1,6-hexanediol diacrylate as photo-polymerizable unsaturated monomers (2), 20 parts by weight of N-(3-dimethylaminopropyl) acrylamide as amino group-containing compound (3), 3 parts by weight of 2,2-dimethoxyphenyl acetophenone as photo-polymerization initiator (4), 30 parts by weight of styrene-isoprene-styrene block copolymer (JSR SIS5000; made by Japan Synthetic Rubber Co.) as block copolymer component, and 0.5 parts by weight of p-t-butylcatechol as storage stabilizer. The mixture was stirred in a kneader which was temperature-adjusted to 50° C., for 50 minutes, and thus a photosensitive resin composition of the invention was obtained. The obtained resin composition was found to be of a transparent wax form.

Evaluation

A photosensitive resin layer having a thickness of 0.5 mm was formed on a polyester sheet using the obtained photosensitive resin composition. The photosensitive resin layer on the polyester sheet was subjected to brushing in warm water at 30° C. and the time taken until the resin layer disappeared was measured by using a developing machine (model: JOW-A4-P) made by Nihon Denshi Seiki K.K.

The resin plate was exposed for six minutes by using an exposure machine (JE-A$_3$-SS) made by Nihon Denshi Seiki K.K. and then measurement was made of the exposed resin plate in tensile strength, elongation at break, and impact resilience (determined according to JIS K6301).

As a result, the obtained composition was found satisfactory in both water developability and impact resilience. Further, the measurements showed that the composition was also satisfactory in elongation at break and resin plate strength and had good property balance.

The measurement results are shown in Table 1.

Example 2

A composition of the invention was fabricated using same components as and in accordance with the same procedure as in Example 1, except that 1,3-butadiene/ω-carboxy di(pentamethylene carboxy) oxyacrylate/ethylene glycol dimethacrylate/styrene were used as monomer components in the ratio (mol %) of 88/5/1/6 and were subjected to emulsion polymerization in the same manner as in Example 1 to produce a granular copolymer (1).

Particle size measurement of the copolymer latex obtained witnessed a mean particle size of 73 nm.

The obtained composition was found satisfactory in both water developability and impact resilience. Further, it was found that the composition was also satisfactory in elongation at break and resin plate strength and had good property balance.

The measurement results are shown in Table 1.

Example 3

1,3-butadiene/ω-carboxy di(pentamethylene carboxy) oxyacrylate/ethylene glycol dimethacrylate/styrene (mol %) were used as monomer components in the ratio of 88/5/1/6 and were subjected to emulsion polymerization in the same manner as in Example 1 to produce a granular copolymer (1). The copolymer latex had a mean particle size of 73 nm.

To 100 parts by weight of the granular copolymer (1) were added 30 parts by weight of lauryl methacrylate and 20 parts by weight of 1,6-hexanediol diacrylate as photo-polymerizable unsaturated monomers (2), 20 parts by weight of N-(2-diethylaminoethyl) methacrylate as amino group-containing compound (3), 3 parts by weight of 2,2-dimethoxyphenyl acetophenone as photo-polymerization initiator (4), 30 parts by weight of styrene-butadiene-styrene block copolymer (JSR TR2000; made by Japan Synthetic Rubber Co.) as block copolymer component, and 0.5 parts by weight of p-t-butylcatechol as storage stabilizer. The mixture was produced into a photosensitive resin composition of the invention according to the same procedure as in Example 1. Evaluation was made in the same manner as in Example 1.

The obtained composition was found satisfactory in both water developability and impact resilience. Further, it was found that the composition was also satisfactory in elongation at break and resin plate strength and had good property balance.

The measurement results are shown in Table 1.

Example 4

1,3-butadiene/ω-carboxy mono(pentamethylene carboxy) oxyacrylate/divinylbenzene/methyl methacrylate were used as monomer components in the ratio (mol %) of 88/5/1/6 and were subjected to emulsion polymerization to produce a granular copolymer (1). The copolymer latex had a mean particle size of 72 nm.

To 100 parts by weight of the copolymer (1) obtained were added 30 parts by weight of lauryl methacrylate and 20 parts by weight of 1,6-hexanediol diacrylate as photo-polymerizable unsaturated monomers (2), 20 parts by weight of N-(2-diethylaminoethyl) methacrylate as amino group-containing compound (3), 1 part by weight of 2,2-dimethoxyphenyl acetophenone as photo-polymerization initiator (4), and 0.5 parts by weight of p-t-butylcatechol as storage stabilizer. The mixture was produced into a photosensitive resin composition of the invention according to the same procedure as in Example 1. Evaluation was made in the same manner as in Example 1.

The obtained composition was found satisfactory in both water developability and impact resilience. Further, it was found that the composition was also satisfactory in elongation at break and resin plate mechanical strength and had good property balance.

The measurement results are shown in Table 1.

Comparative Example 1

1,3-butadiene/divinylbenzene/methyl methacrylate/methacrylic acid were used as monomer components in the ratio (mol %) of 80/1/12/7 and subjected to emulsion polymerization in the same manner as in Example 1 to produce a granular copolymer.

Particle size measurement of the copolymer latex obtained showed a mean particle size of 71 nm.

To 100 parts by weight of the copolymer were added 30 parts by weight of lauryl methacrylate, 20 parts by weight of 1,6-hexanediol diacrylate, 20 parts by weight of N-(3-dimethylaminopropyl) acrylamide, 3 parts by weight of 2,2-dimethoxyphenyl acetophenone, 30 parts by weight of styrene-isoprene-styrene block copolymer (SIS5000; made by Japan Synthetic Rubber Co.), and 0.5 parts by weight of p-t-butylcatechol. The mixture was stirred in a kneader which was temperature-adjusted to 50° C., for 30 minutes, and thus a photosensitive resin composition was obtained. The obtained resin composition was found to be of a transparent wax form.

The photosensitive resin composition obtained was evaluated according to the procedure as used in Example 1. The use of methacrylic acid in the preparation of the granular copolymer resulted in unfavorable water developability and lower impact resilience.

The measurement results are shown in Table 1. In the same manner as described above, Examples 5 and 6 and Comparative Example 2 were conducted. The results are also shown in Table 1.

TABLE 1

| Component | Photosensitive Resin Composition | | Example | | | | | | Comp. Ex. | |
|---|---|---|---|---|---|---|---|---|---|---|
| | | | 1 | 2 | 3 | 4 | 5 | 6 | 1 | 2 |
| 1 | Parts by weight | | 100 | 100 | 100 | 100 | 100 | 100 | 100 | 100 |
| | Copolymer composition (mol %) | | | | | | | | | |
| | 1) butadiene | | 80 | 88 | 88 | 88 | 80 | 92 | 80 | 92 |
| | 2) ω-carboxy di(pentamethylene carboxy)oxyacrylate (*1) | | 7 | 5 | 5 | — | 6 | 7 | — | — |
| | ω-carboxy mono(pentamethylene carboxy)oxyacrylate | | — | — | — | 5 | — | — | — | — |
| | 3) ethylene glycol dimethacrylate | | — | 1 | 1 | — | — | — | — | — |
| | divinylbenzene | | 1 | — | — | 1 | 1 | 1 | 1 | 1 |
| | 4) methyl methacrylate | | 12 | — | — | 6 | 12 | — | 12 | — |
| | styrene | | — | 6 | 6 | — | — | — | — | — |
| | methacrylic acid | | — | — | — | — | 1 | — | 7 | 7 |
| 2 | lauryl methacrylate | (parts by wt) | 30 | 30 | 30 | 30 | 30 | 30 | 30 | 30 |
| | 1,6-hexanediol diacrylate | | 20 | 20 | 20 | 20 | 20 | 20 | 20 | 20 |
| 3 | N-(3-dimethylaminopropyl) acrylamide | (parts by wt) | 20 | 20 | — | — | 10 | 20 | 20 | 20 |
| | N-(2-diethylaminoethyl) methacrylate | | — | — | 20 | 20 | — | — | — | — |
| 4 | 2,2-dimethoxyphenyl acetophenone | (parts by wt) | 3.0 | 3.0 | 3.0 | 1.0 | 3.0 | 3.0 | 3.0 | 3.0 |

TABLE 1-continued

| Component | Photosensitive Resin Composition | | Example | | | | | | Comp. Ex. | |
|---|---|---|---|---|---|---|---|---|---|---|
| | | | 1 | 2 | 3 | 4 | 5 | 6 | 1 | 2 |
| — | styrene-butadiene-styrene block copolymer (*2) | (parts by wt) | — | — | 30 | — | — | — | — | — |
| | styrene-isoprene-styrene block copolymer (*3) | | 30 | 30 | — | — | — | 30 | 30 | 30 |
| | p-t-butylcatechol | | 0.5 | 0.5 | 0.5 | 0.5 | 0.5 | 0.5 | 0.5 | 0.5 |
| (Evaluation Items) | | | | | | | | | | |
| | Washout time (sec) | | 185 | 190 | 195 | 100 | 85 | 190 | 270 | 250 |
| | Tensile strength (kgf/cm$^2$) | | 34 | 35 | 34 | 29 | 28 | 31 | 26 | 25 |
| | Elongation at break (%) | | 160 | 170 | 150 | 120 | 110 | 180 | 120 | 150 |
| | Impact resilience | | 35 | 36 | 34 | 33 | 30 | 38 | 26 | 28 |

(*1) $CH_2 = CHCOO-(C_5H_{10}COO)_2-H$
(*2) JSR TR2000 made by Japan Synthetic Rubber Co.
(*3) JSR SIS5000 made by Japan Synthetic Rubber Co.

The photosensitive resin composition of the present invention can exhibit good water developability, high impact resilience, high post-exposure resin plate strength, high elongation at break, and good resin plate transparency.

The water-developable photosensitive resin composition of the invention can be freely adjusted within a wide configurational range of from a non-flow wax-like or rubber-like form to a low-viscosity liquid form, and has good processability.

What is claimed is:

1. A water-developable photosensitive resin composition comprising:
   (1) granular copolymer particles produced by polymerizing a monomer mixture ((i)+(ii)+(iii)+(iv)=100 mol %) comprising:
      (i) 10 to 95 mol % of an aliphatic conjugated diene monomer,
      (ii) 0.1 to 30 mol % of a monomer represented by the following general formula (I):

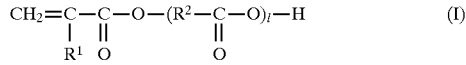

in which R$^1$ represents a hydrogen atom or a methyl group, R$^2$ represents an alkylene group having a carbon number of 3 to 20, and l represents an integer of 1 to 20,
      (iii) 0.1 to 20 mol % of a monomer having at least two addition-polymerizable groups, and
      (iv) 0 to 70 mol % of an addition-polymerizable monomer other than (i), (ii) and (iii);
   (2) a photo-polymerizable unsaturated monomer;
   (3) an amino group-containing compound, and
   (4) a photo-polymerization initiator.

2. A water-developable photosensitive resin composition of claim 1, in which the aliphatic conjugated diene monomer (i) is selected from the group consisting of 1,3-butadiene and isoprene.

3. A water-developable photosensitive resin composition of claim 1, in which the monomer represented by the formula (I) is a (meth)acrylic acid modified with ε-caprolactone of l being 1–4.

4. A water-developable photosensitive resin composition of claim 1, in which the monomer having at least two addition-polymerizable groups is selected from the group consisting of divinyl benzene and ethylene glycol (meth)acrylate.

5. A water-developable photosensitive resin composition of claim 1, in which the copolymer (1) is in particle form having a particle size of 10–300 nm prepared by an emulsion polymerization.

6. A water-developable photosensitive resin composition of claim 1, in which the photo-polymerizable unsaturated monomer is selected from the group consisting of alkyl (meth)acrylate and alkylene glycol (meth)acrylate.

7. A water-developable photosensitive resin composition of claim 1, in which the amino group-containing compound is a tertiary amino group-containing α,β-ethylenically unsaturated group.

8. A water-developable photosensitive resin composition of claim 1 which comprises:
   (1) granular copolymer particles of 100 parts by weight,
   (2) a photo-polymerizable unsaturated monomer of 10–500 parts by weight,
   (3) an amino group-containing compound of 2–50 parts by weight, and
   (4) a photo-polymerization initiator of 0.1–20 parts by weight.

9. A water-developable photosensitive resin composition of any one of claims 1 to 8, which additionally comprises a block copolymer composed of a hard segment of non-elastic polymer having a glass transition point of not lower than 20° C. and a soft segment of an elastic polymer having a glass transition point of not higher than 10° C. in the amount of less than 100 parts by weight relative to 100 parts by weight of the copolymer (1).

10. A water-developable photosensitive resin composition of claim 9, in which the thermoplastic polymer of the hard segment is a homo- or copolymer of monomers selected from the group consisting of styrene, t-butyl styrene, α-methyl styrene, p-methyl styrene, divinyl benzene, 1,1-diphenyl styrene, N,N-dimethyl-p-aminoethyl styrene, N,N-diethyl-p-aminoethyl styrene and vinyl pyridine.

11. A water-developable photosensitive resin composition of claim 9, in which the elastic polymer of the soft segment is a homo- or copolymer of monomers selected from the group consisting of 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3-butyl-1,3-octadiene and chloroprene.

12. A flexographic printing plate having a photographic layer formed of a water-developable photosensitive resin composition, the composition comprising:
   (1) granular copolymer particles produced by polymerizing a monomer mixture ((i)+(ii)+(iii)+(iv)100 mol %) comprising:
      (i) 10 to 95 mol % of an aliphatic conjugated diene monomer,
      (ii) 0.1 to 30 mol % of a monomer represented by the following general formula (I):

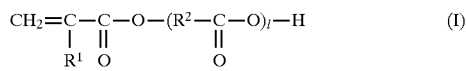

in which $R^1$ represents a hydrogen atom or a methyl group, $R^2$ represents an alkylene group having a carbon number of 3 to 20, and l represents an integer of 1 to 20, (iii) 0.1 to 20 mol % of a monomer having at least two addition-polymerizable groups, and (iv) 0 to 70 mol % of an addition-polymerizable monomer other than (i), (ii) and (iii);

(2) a photo-polymerizable unsaturated monomer;

(3) an amino group-containing compound, and (4) a photo-polymerization initiator.

13. A flexographic printing plate of claim 12, in which the aliphatic conjugated diene monomer (i) is selected from the group consisting of 1,3-butadiene and isoprene.

14. A flexographic printing plate of claim 12, in which the monomer represented by the formula (I) is a (meth)acrylic acid modified with ε-caprolactone of l being 1–4.

15. A flexographic printing plate of claim 12, in which the monomer having at least two addition-polymerizable groups is selected from the group consisting of divinyl benzene and ethylene glycol (meth)acrylate.

16. A flexographic printing plate of claim 12, in which the copolymer (1) is particle form having a particle size of 10–300 nm prepared by an emulsion polymerization.

17. A flexographic printing plate of claim 12, in which the photo-polymerizable unsaturated monomer is selected from the group consisting of alkyl (meth)acrylate and alkylene glycol (meth)acrylate.

18. A flexographic printing plate of claim 12, in which the amino group-containing compound is a tertiary amino group-containing α,β-ethylenically unsaturated group.

19. A flexographic printing plate of claim 12, which comprises:

(1) granular copolymer particles of 100 parts by weight, (2) a photo-polymerizable unsaturated monomer of 10–500 parts by weight, (3) an amino group-containing compound of 2–50 parts by weight, and (4) a photo-polymerization initiator of 0.1–20 parts by weight.

20. A flexographic printing plate of any one of claims 12 to 18, in which the water-developable photosensitive resin composition additionally comprises a block copolymer composed of a hard segment of thermoplastic, non-elastic polymer having a glass transition point of not lower than 20° C. and a soft segment of an elastic polymer having a glass transition point of not higher than 10° C. in the amount of less than 100 parts by weight relative to 100 parts by weight of the copolymer (1).

21. A flexographic printing plate of claim 20, in which the thermoplastic polymer of the hard segment is a homo- or copolymer of monomers selected from the group consisting of styrene, t-butyl styrene, α-methyl styrene, p-methyl styrene, divinyl benzene, 1,1-diphenyl styrene, N,N-dimethyl-p-aminoethyl styrene, N,N-diethyl-p-aminoethyl styrene and vinyl pyridine.

22. A flexographic printing plate of claim 20, in which the elastic polymer of the soft segment is a homo- or copolymer from monomers selected from the group consisting of 1,3-butadiene, isoprene, 2,3-dimethyl-1,3-butadiene, 1,3-pentadiene, 2-methyl-1,3-pentadiene, 1,3-hexadiene, 4,5-diethyl-1,3-octadiene, 3-butyl-1,3-octadiene and chloroprene.

\* \* \* \* \*